US009214400B2

(12) United States Patent
Zhu et al.

(10) Patent No.: US 9,214,400 B2
(45) Date of Patent: Dec. 15, 2015

(54) SEMICONDUCTOR DEVICE WITH BACK GATE ISOLATION REGIONS AND METHOD FOR MANUFACTURING THE SAME

(75) Inventors: Huilong Zhu, Poughkeepsie, NY (US); Qingqing Liang, Lagrangeville, NY (US); Zhijiong Luo, Poughkeepsie, NY (US); Haizhou Yin, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 13/504,643

(22) PCT Filed: Nov. 18, 2011

(86) PCT No.: PCT/CN2011/082404
§ 371 (c)(1),
(2), (4) Date: Apr. 27, 2012

(87) PCT Pub. No.: WO2013/029310
PCT Pub. Date: Mar. 7, 2013

(65) Prior Publication Data
US 2013/0049116 A1    Feb. 28, 2013

(30) Foreign Application Priority Data

Aug. 31, 2011    (CN) .......................... 2011 1 0254440

(51) Int. Cl.
*H01L 27/12*    (2006.01)
*H01L 21/84*    (2006.01)

(52) U.S. Cl.
CPC ............ *H01L 21/84* (2013.01); *H01L 27/1203* (2013.01)

(58) Field of Classification Search
CPC . H01L 21/761; H01L 27/098; H01L 27/0928; H01L 29/0619; H01L 29/1058; H01L 29/1066; H01L 21/762; H01L 21/7624; H01L 21/76264; H01L 21/1203; H01L 27/1207; H01L 2027/11857; H01L 29/7812; H01L 29/7824; H01L 21/823492; H01L 21/823493; H01L 21/265; H01L 29/0615; H01L 29/063; H01L 29/0646; H01L 21/84; H01L 27/1203; H01L 21/76224; H01L 21/76229; H01L 21/76232
USPC .......... 257/544, 547, 347; 438/220, 223, 224, 438/479
See application file for complete search history.

(56) References Cited

U.S. PATENT DOCUMENTS 6,072,217 A *  6/2000  Burr ............................. 257/351
6,420,771 B2 *  7/2002  Gregory ....................... 257/517

(Continued)

OTHER PUBLICATIONS

International Search Report for PCT/CN2011/082404 dated Mar. 7, 2013 with English Translation.*

(Continued)

*Primary Examiner* — Khiem D Nguyen
*Assistant Examiner* — Pauline Vu
(74) *Attorney, Agent, or Firm* — Kinney & Lange, P.A.

(57) ABSTRACT

The present disclosure provides a semiconductor device and a method for manufacturing the same. The semiconductor device comprises: an SOI wafer comprising a semiconductor substrate, an insulating buried layer, and a semiconductor layer, wherein the insulating buried layer is disposed on the semiconductor substrate, and the semiconductor layer is disposed on the insulating buried layer; adjacent MOSFETs formed in the SOI wafer, wherein each of the adjacent MOSFETs comprises a back gate formed in the semiconductor substrate and a back gate isolation region formed completely under the back gate; and a shallow trench isolation, wherein the shallow trench isolation is formed between the adjacent MOSFETs to isolate the adjacent MOSFETs from each other, wherein a PN junction is formed between the back gate and the back gate isolation region of each of the adjacent MOSFETs. According to embodiments of the present disclosure, a PN junction is formed between the back gate isolation regions of the adjacent MOSFETs. In addition to back gate isolation implemented by the shallow trench isolation between the adjacent MOSFETs, the adjacent MOSFETs are also isolated by means of PNPN junctions or NPNP junctions formed in the back gates and the back gate isolation regions. As a result, the semiconductor device has a better isolation effect, and thus the possibility of accidental breakdown of the semiconductor device is substantially reduced.

12 Claims, 7 Drawing Sheets

(56) References Cited

U.S. PATENT DOCUMENTS

| | | | |
|---|---|---|---|
| 6,624,496 B2* | 9/2003 | Ku et al. | 257/510 |
| 7,023,054 B2* | 4/2006 | Ohsawa | 257/369 |
| 7,453,090 B2* | 11/2008 | Ito | 257/75 |
| 7,759,714 B2* | 7/2010 | Itoh et al. | 257/296 |
| 7,767,546 B1* | 8/2010 | Dennard et al. | 438/458 |
| 2003/0001658 A1* | 1/2003 | Matsumoto | 327/534 |
| 2004/0012068 A1* | 1/2004 | Iwata et al. | 257/506 |
| 2005/0048701 A1* | 3/2005 | Minato et al. | 438/135 |
| 2007/0138533 A1* | 6/2007 | Dennard et al. | 257/314 |
| 2007/0210418 A1* | 9/2007 | Nakajima | 257/547 |
| 2009/0096036 A1* | 4/2009 | Ishigaki et al. | 257/392 |
| 2009/0302366 A1* | 12/2009 | Anderson et al. | 257/301 |
| 2011/0074498 A1* | 3/2011 | Thompson et al. | 327/543 |
| 2011/0108942 A1* | 5/2011 | Fenouillet-Beranger et al. | 257/503 |
| 2011/0124177 A1* | 5/2011 | Botula et al. | 438/424 |
| 2011/0133822 A1* | 6/2011 | Mazure et al. | 327/537 |
| 2011/0134690 A1* | 6/2011 | Mazure et al. | 365/184 |
| 2012/0256260 A1* | 10/2012 | Cheng et al. | 257/347 |
| 2012/0261792 A1* | 10/2012 | Cheng et al. | 257/510 |
| 2012/0292700 A1* | 11/2012 | Khakifirooz et al. | 257/347 |
| 2012/0299080 A1* | 11/2012 | Dennard et al. | 257/316 |
| 2012/0299105 A1* | 11/2012 | Cai et al. | 257/348 |

OTHER PUBLICATIONS

Yan et al., "Scaling the Si MOSFET: From Bulk to SOI to Bulk," IEEE Transactions on Electron Devices, vol. 39, No. 7, Jul. 1992.

* cited by examiner

SEMICONDUCTOR DEVICE WITH BACK GATE ISOLATION REGIONS AND METHOD FOR MANUFACTURING THE SAME

CROSS-REFERENCE TO RELATED APPLICATION(S)

This application is a National Phase application of, and claims priority to, PCT Application No. PCT/CN2011/082404, filed on Nov. 11, 2011, entitled "SEMICONDUCTOR DEVICE AND METHOD FOR MANUFACTURING THE SAME", which claimed priority to Chinese Application No. 201110254440.6, filed on Aug. 31, 2011. Both the PCT Application and Chinese Application are incorporated herein by reference in their entireties.

TECHNICAL FIELD

The present disclosure relates to a semiconductor device and a method for manufacturing the same. In particular, the present disclosure relates to a semiconductor device with a back gate isolation region and a method for manufacturing the same.

BACKGROUND

An important development direction of integrated circuit technology is scaling down the size of the Metal Oxide Semiconductor Field Effect Transistor (MOSFET), whereby to improve integration level and to reduce manufacturing cost. However, it is well-known that the scaling down of the size of the MOSFET will cause short channel effects. With the scaling down of the size of the MOSFET, the effective length of the gate is shrinking, causing the proportion of the depletion layer charges effectively controlled by the gate voltage to diminish. As a result, the threshold voltage drops with the reduction of the channel length.

In a MOSFET, it is usually desirable to increase the threshold voltage of the device to suppress the short channel effects. However, on the other hand, it is also desirable to reduce the threshold voltage of the device to reduce power consumption, especially in applications with low-voltage power supply and applications where both P-type and N-type MOSFETs are used.

A known method for adjusting the threshold voltage is channel doping. However, if the doping concentration of the channel region is increased to increase the threshold voltage of the device, the mobility of carriers will decrease. As a result, the performance of the device will degrade. Moreover, the heavily-doped ions in the channel region may neutralize the ions in portions of the source region and the drain region adjacent to the channel region, such that the ion concentration in these portions will decrease and the device resistance will increases.

Yan et al. proposed in "Scaling the Si MOSFET: From bulk to SOI to bulk", IEEE Trans. Elect. Dev., Vol. 39, p. 1704, July 1992 that the short channel effects can be suppressed by disposing a ground plane (a grounded back gate) under the insulating buried layer in an SOI (Semiconductor on Insulator) MOSFET.

In case that a plurality of MOSFETs are integrated on a wafer, for each MOSFET, a back gate can be disposed under the insulating buried layer. Different bias electrical fields can be applied to the back gates so that the threshold voltage of each MOSFET can be adjusted individually. However, when the size of the device becomes smaller continuously, there has arisen a problem of ensuring electrical isolation between the back gates of adjacent MOSFET devices. Furthermore, it has become difficult to ensuring electrical isolation between conductive paths of adjacent MOSFET devices.

SUMMARY

The present disclosure, among other things, provides a semiconductor device with a back gate isolation region and a method for manufacturing the same. The back gate region is formed under the gate of the semiconductor device, so that back gate conductive paths of adjacent MOSFETs are electrically isolated from each other by means of PNPN junctions or NPNP junctions formed by the back gates and the back gate isolation regions.

An aspect of the present disclosure provides a semiconductor device, comprising: an SOI wafer, which comprises a semiconductor substrate, an insulating buried layer, and a semiconductor layer, wherein the insulating buried layer is disposed on the semiconductor substrate, and the semiconductor layer is disposed on the insulating buried layer; MOSFETs formed in the SOI wafer, wherein each of the MOSFETs comprises a back gate and a back gate isolation region, the back gate being formed in the semiconductor substrate, and the back gate isolation region being formed under the back gate; and a shallow trench isolation, wherein the shallow trench isolation is formed between adjacent MOSFETs to isolate the adjacent MOSFETs from each other, wherein a PN junction is formed between the back gate and the back gate isolation region of each of the MOSFETs.

Optionally, a PN junction may be formed between the back gate isolation regions of adjacent MOSFETs.

Optionally, the shallow trench isolation may comprise: a first portion, which extends into the semiconductor substrate to isolate the back gates of adjacent MOSFETs; and a second portion, which extends laterally on the insulating buried layer to isolate the semiconductor layers of adjacent MOSFETs to define respective active regions of the adjacent MOSFETs, wherein the first portion has a width smaller than that of the second portion.

Optionally, the shallow trench isolation may extend laterally on the insulating buried layer to isolate the semiconductor layers of adjacent MOSFETs to define respective active regions of the adjacent MOSFETs. Furthermore, the shallow trench isolation may also comprise a portion extending to a surface of the semiconductor substrate.

Optionally, the back gate may abut the insulating buried layer.

Optionally, the back gate may be separated from the insulating buried layer by a distance.

Optionally, each of the MOSFETs may further comprise: a gate stack disposed on the semiconductor layer; a source region and a drain region formed in the semiconductor layer and disposed outside the gate stack; and a channel region formed in the semiconductor layer and between the source region and the drain region.

Optionally, each of the MOSFETs may further comprise: source/drain conductive paths electrically connected with the source region and the drain region, respectively; and a back gate conductive path electrically connected with the back gate.

Another aspect of the present disclosure provides a method for manufacturing a semiconductor device, comprising: providing an SOI wafer comprising a semiconductor substrate, an insulating buried layer, and a semiconductor layer, wherein the insulating buried layer is disposed on the semiconductor substrate, and the semiconductor layer is disposed on the insulating buried layer; forming a shallow trench isolation in the SOI wafer to isolate adjacent MOSFETs; and forming the MOSFETs in the SOI wafer, each of the MOSFETs comprising a back gate formed in the semiconductor substrate and a back gate isolation region formed under the back gate, wherein a PN junction is formed between the back gate and the back gate isolation region of each of the MOSFETs.

Optionally, a PN junction may be formed between the back gate isolation regions of adjacent MOSFETs.

Optionally, forming the MOSFETs may comprise: conducting a first ion implantation with a first dopant at a relatively deep position in a first region of the semiconductor substrate to form the back gate isolation region of a first MOSFET at the relatively deep position of the semiconductor substrate; and conducting a second ion implantation with a second dopant at a relatively shallow position in the first region of the semiconductor substrate to form the back gate of the first MOSFET at the relatively shallow position of the semiconductor substrate, wherein the polarity of the second dopant is opposite to the polarity of the first dopant.

Furthermore, forming the MOSFETs may further comprise: conducting a third ion implantation with a third dopant at a relatively deep position in a second region of the semiconductor substrate, the second region being adjacent to the first region, to form the back gate isolation region of a second MOSFET at the relatively deep position of the semiconductor substrate; and conducting a fourth ion implantation with a fourth dopant at a relatively shallow position in the second region of the semiconductor substrate to form the back gate of the second MOSFET at the relatively shallow position of the semiconductor substrate, wherein the polarity of the third dopant is opposite to the polarity of the first dopant, and the polarity of the fourth dopant is the same as the polarity of the first dopant.

Optionally, forming the shallow trench isolations may comprise: patterning the SOI wafer to form a first portion of the shallow trench isolation, wherein the first portion extends into the semiconductor substrate to a depth to isolate the back gates of the adjacent MOSFETs; and further patterning the SOI wafer to form a second portion of the shallow trench isolation, wherein the second portion extends laterally on the insulating buried layer to isolate the semiconductor layers of the adjacent MOSFETs, wherein the first portion has a width smaller than the width of the second portion.

Optionally, forming the shallow trench isolations may comprise: patterning the SOI wafer to form a portion of the shallow trench isolation, the portion of the shallow trench isolation extending laterally on the insulating buried layer to isolate the semiconductor layers of adjacent MOSFETs. Furthermore, before forming the portion of the shallow trench isolation extending laterally on the insulating buried layer, the SOI wafer may be patterned to form another portion of the shallow trench isolation, the another portion of the shallow trench isolation extending to a surface of the semiconductor substrate.

Optionally, forming each of the MOSFETs may comprise: forming a gate stack on the semiconductor layer; and forming a source region and a drain region in the semiconductor layer and outside the gate stack.

Optionally, forming each of the MOSFETs may comprise: forming conductive source/drain conductive paths electrically connected with the source region and the drain region, respectively; and forming a back gate conductive path electrically connected with the back gate.

As described above, the present disclosure provides an MOSFET with a back gate isolation region. The back gate isolation region is formed under a back gate of the MOSFET. The back gate and the back gate isolation region have different doping polarities and different bias electrical fields. The back gates of adjacent MOSFETs, as well as the back gate isolation regions of the adjacent MOSFETs, have different doping polarities and different bias electrical fields. As a result, in addition to back gate isolation implemented by shallow trench isolations between the adjacent MOSFETs, the adjacent MOSFETs are also isolated by means of PNPN junctions or NPNP junctions formed in the back gates and the back gate isolation regions of the adjacent MOSFETs. Accordingly, the back gate conductive paths of the adjacent MOSFETs are electrically isolated from each other by means of the PNPN junctions or the NPNP junctions. Compared with conventional MOSFETs, such a device structure has a better isolation effect, and thus the possibility of accidental breakdown of the device is substantially reduced.

Also, in an embodiment where the shallow trench isolations do not extend into the semiconductor substrate, a single voltage can be applied to the back gates of the MOSFETs on both sides of each shallow trench isolation. As a result, it is possible to arrange only one back gate conductive path in the semiconductor device, whereby a less number of back conductive paths can be used and a smaller area can be consumed. Consequently, process flow can be simplified and cost can be saved.

DETAILED DESCRIPTION OF EMBODIMENTS

Figure 1:
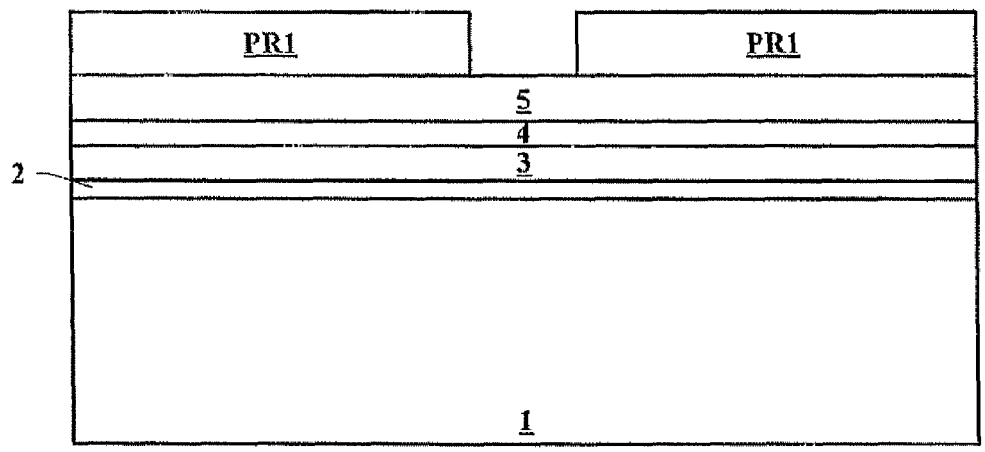
FIGS. 1-13 schematically show sectional views of respective steps of a method for manufacturing a semiconductor device according to the present disclosure.

The present disclosure will be further explained in detail with reference to the drawings. In the drawings, respective parts are not drawn to scale for purpose of clarity.

The following description set forth various specific details of the present disclosure, e.g. structures, materials, sizes, processing methods, and technologies, to facilitate understanding of the present disclosure. However, those skilled in the art will understand that the present disclosure can be implemented without these specific details. Various parts of the semiconductor device can be formed of materials well-known to those skilled in the art, unless being particularly specified otherwise.

In the present disclosure, the term "semiconductor structure" refers to the semiconductor substrate and all layers or regions that have been formed on the semiconductor substrate, which are formed after respective steps of the method for manufacturing the semiconductor device.

FIG. 1-FIG. 13 show respective steps of a method for manufacturing MOSFETs according to one embodiment of the present disclosure.

As shown in FIG. 1, an ordinary SOI wafer is provided. The SOI wafer has an initial structure comprising a semiconductor substrate 1, an insulating buried layer 2, and a semiconductor layer 3, which are disposed in this order in a bottom-top fashion. The semiconductor layer 3 may have a thickness of about 5 nm-20 nm, which may be 10 nm or 15 nm, for example. The insulating buried layer 2 may have a thickness of about 5 nm-30 nm, which may be one of 10 nm, 15 nm, 20 nm, and 25 nm. The insulating buried layer 2 may comprise one of a Buried Oxide (BOX) layer, a buried oxynitride layer, and other insulating buried layers. In an optional embodiment, the insulating buried layer may be an Ultra-Thin Buried Oxide layer.

The semiconductor substrate 1 may be used to form a back gate of the MOSFET. The semiconductor substrate 1 may comprise one of bulk silicon, IV group semiconductor materials (e.g., SiGe or Ge), and III-V group compound semiconductor materials (e.g., GaAs). The semiconductor layer 3 may comprise one of IV group semiconductor materials (e.g., Si, Ge, or SiGe) and III-V group compound semiconductor materials (e.g., GaAs). In this embodiment, the semiconductor layer 3 may be monocrystal Si or SiGe. The semiconductor layer 3 is used to provide a source region, a drain region, and a channel region of the MOSFET.

As shown in FIG. 1, an oxide (e.g., silicon oxide) layer 4 and a nitride (e.g., silicon nitride) layer 5 are deposited in this order on the SOI wafer. For example, the oxide layer may have a thickness of about 5-20 nm, and the nitride layer may have a thickness of about 30-100 nm. The oxide layer and the nitride layer will be used as a hard mask layer in a later Chemical Mechanical Polish (CMP) step. Then a patterned photoresist mask PR1 is formed on the nitride layer. Regions that are not covered by the photoresist mask PR1 correspond to the shallow trench isolations which are to be formed.

Processes for forming the SOI wafer are known. For example, a SmartCut™ method may be used. The method comprises bonding two wafers with each other, wherein each wafer comprises an oxide surface layer formed by thermal oxidation or deposition. One of the two wafers has been processed by hydrogen implantation, whereby a hydrogen implantation region is formed in the silicon at a certain depth under the oxide surface layer. The hydrogen implantation region becomes a micro porous layer under a high pressure and at a high temperature, which micro porous layer helps to separate the portions on two sides of the micro porous layer. After the separation, the portion comprising the oxide surface layer being bonded is used as the SOI wafer. The thickness of the insulating buried layer of the SOI wafer can be changed by controlling process parameters of the thermal oxidation or the deposition. The thickness of the semiconductor layer in the SOI wafer can be changed by controlling hydrogen implantation energy.

Figure 2:
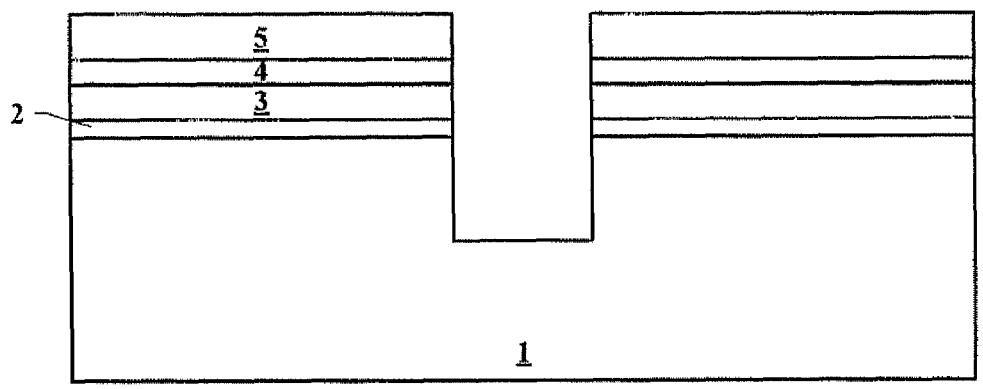

Then, the SOI wafer is patterned to form shallow trench isolations (STIs) for back gate isolations between MOSFET devices, as shown in FIG. 2. In particular, respective layers of the SOI wafer are etched by means of etching (e.g., Reactive Ion Etching (RIE)) with the patterned photoresist mask PR1 as a mask. The etching stops at a depth of about 100-500 nm in the semiconductor substrate 1. As a result, a shallow trench is formed in the semiconductor substrate 1. The shallow trench extends into the semiconductor substrate and is used to isolate the back gates of adjacent MOSFETs that are to be formed. The shallow trench corresponds to a first portion of the shallow trench isolation. After that, the photoresist mask PR1 is removed.

Figure 3:
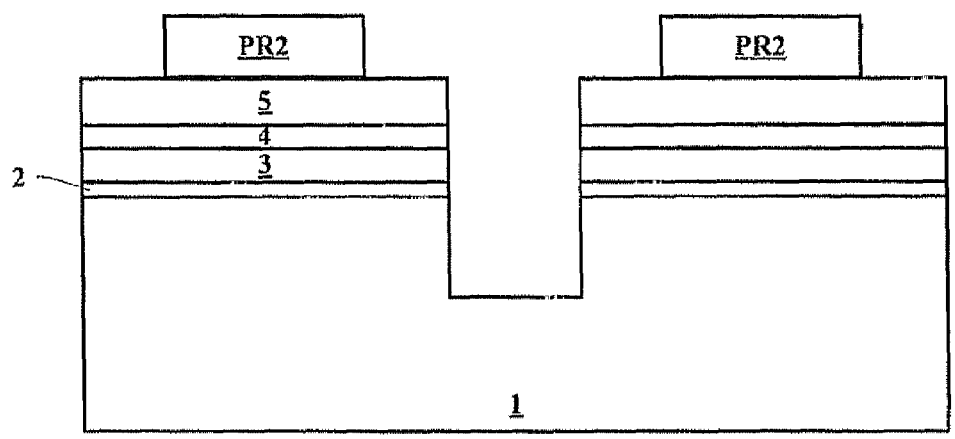

Next, a patterned photoresist mask PR2 is formed on the nitride layer 5 by means of photolithography comprising exposing and developing, as shown in FIG. 3. The regions that are not covered by the photoresist mask PR2 extend laterally above the insulating buried layer and correspond to a second portion of the shallow trench isolation extending laterally.

Figure 4:
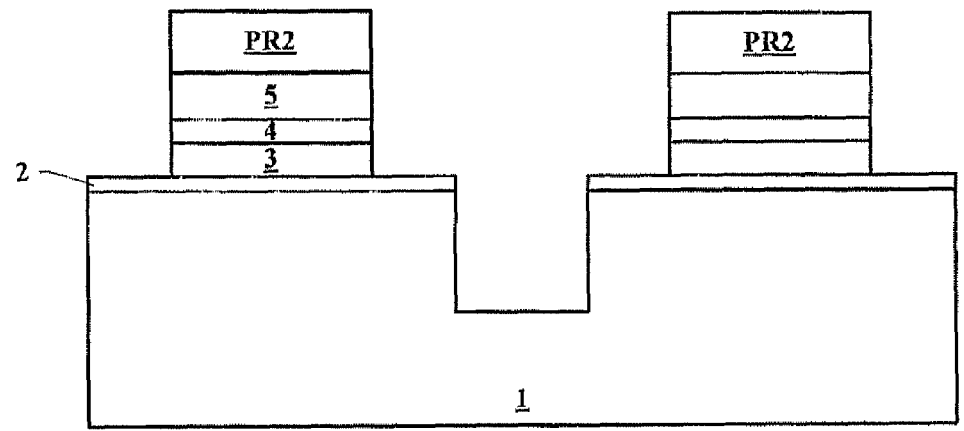

The second portion of the shallow trench isolation extending laterally is formed by further patterning the SOI wafer. In particular, the exposed portions of the SOI wafer are removed by means of dry etching (e.g. ion milling, plasma etching, reactive ion etching, or laser ablation) or by wet etching using an etchant solution. In other words, the portions of the nitride layer 5, the oxide layer 4, and the semiconductor layer 3 that are not covered by the mask are etched away in turn, until the etching stops at the top of the insulating buried layer 2. The etching also increases the depth of the first portion of the shallow trench isolation formed in the semiconductor substrate 1, as shown in FIG. 4. After that, the photoresist mask PR2 is removed by being dissolved in a solution or by cineration.

Figure 5:
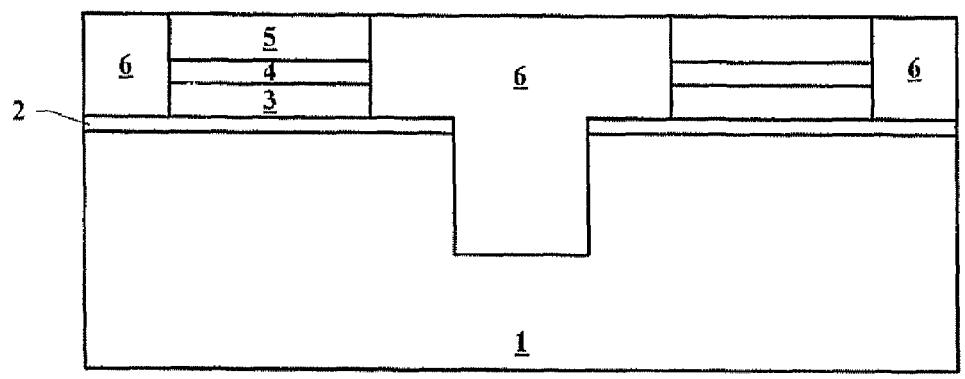

Then, an insulating material is deposited in the formed trench and then is planarized by Chemical Mechanical Polish (CMP) to obtain a planar structure surface. In the specification, terms "planar", "flat", or "be of a same height" mean that a height difference between any two points on the plane is within a tolerance of processing accuracy. In this way, a shallow trench isolation 6 having a top that is of a same height as a top of the nitride layer 5 is formed, as shown in FIG. 5. The shallow trench isolation 6 comprises an insulating material, such as silicon oxide, silicon oxynitride, or silicon nitride, for example. The shallow trench isolation 6 has a "T" shape and comprises a first portion extending into the semiconductor substrate and a second portion extending laterally on the insulating buried layer 2. The first portion of the shallow trench isolation 6 isolates the back gates in substrate regions of two adjacent MOSFETs to be formed. The second portion isolates the active layers (i.e., the semiconductor layers 3) of the two adjacent MOSFETs, to define the active regions of the MOSFETs. In this way, the back gates as well as the active layers of the two adjacent MOSFETs are prevented from being electrically connected.

Figure 6:
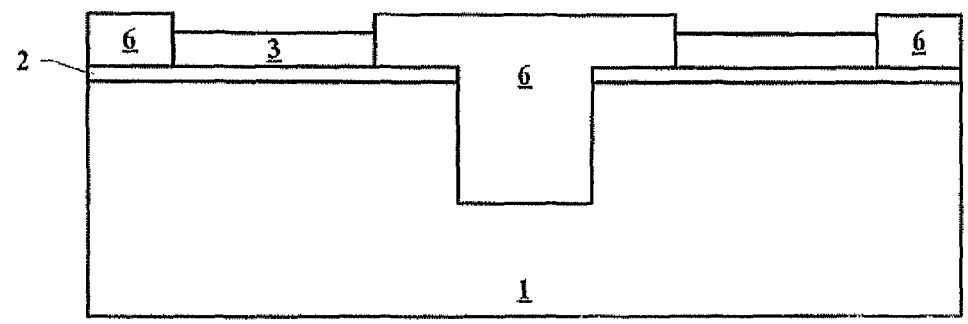

Next, the shallow trench isolation 6 is etched back so that its top surface is higher than the top surface of the semiconductor layer 3. The nitride layer 5 is removed by wet etching (e.g., by hot phosphoric acid). Then the oxide layer 4 is removed by a selective etching process until the top surface of the semiconductor layer 3 is exposed. In this way, a structure as shown in FIG. 6 is formed.

Figure 7:
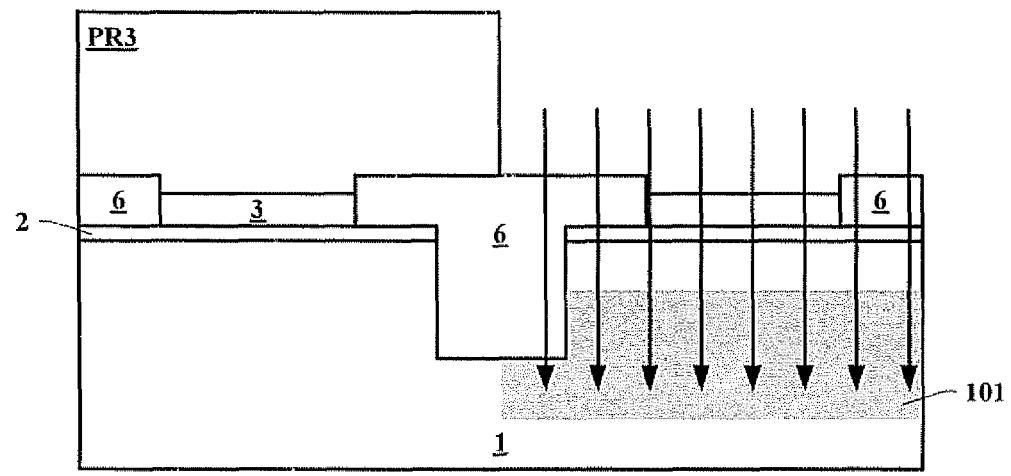
Figure 8:
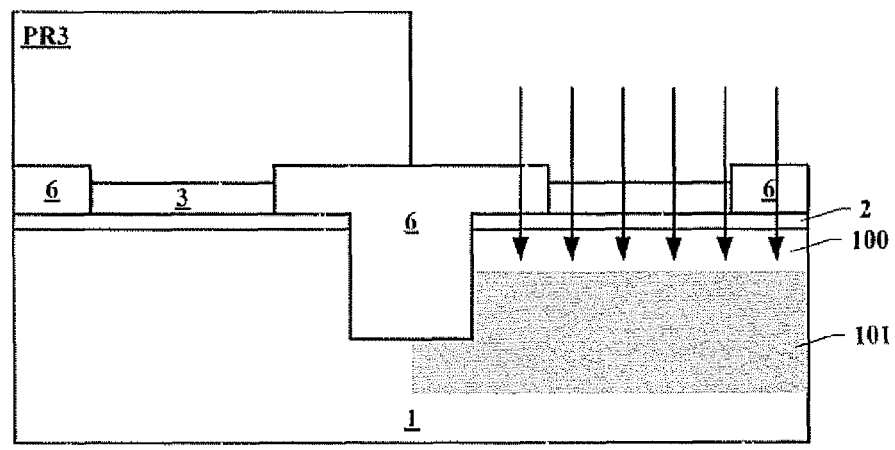

Next, as shown in FIGS. 7 and 8, ion implantations at different depths are conducted in the semiconductor substrate 1 to form the back gates and the back gate isolation regions.

As shown in FIG. 7, a second region on the left side of the SOI wafer is covered by a photoresist mask PR3. A first ion implantation is conducted with a first dopant at a relatively deep position in a first region which is on the right side of the SOI wafer, as indicated by the arrows in FIG. 7. The first region is a region that is adjacent to the second region but is not covered by the photoresist. In this way, a first back gate isolation region 101 is formed at the relatively deep position in the first region of the semiconductor substrate 1.

As shown in FIG. 8, after the first ion implantation is completed, a second ion implantation is conducted with a second dopant at a relatively shallow position in the first region of the SOI wafer, as indicated by the arrows in FIG. 8. In this way, a first back gate 100 is formed at the relatively shallow position in the first region of the semiconductor substrate 1.

The first ion implantation is conducted at the relatively deep position, and the second ion implantation is conducted at the relatively shallow position. Optionally, the polarity of the first dopant is opposite to the polarity of the second dopant. The first back gate 100 and the first back gate isolation region 101 having different electrical conduction types are formed in the first region of the semiconductor substrate 1 by means of the two ion implantations that use dopants of different polarities and are implemented at different depths. As a result, a PN junction is formed between the first back gate 100 and the first back gate isolation region 101. Optionally, the first back gate 100 has a relatively high doping concentration, and the first back gate isolation region 101 has a relatively low doping concentration. This helps to form a PN junction having a PN boundary of a relatively broad (or obscure) width, which can further reduce leakage. After the first and the second ion implantations are completed, the photoresist mask PR3 is removed.

Figure 9:
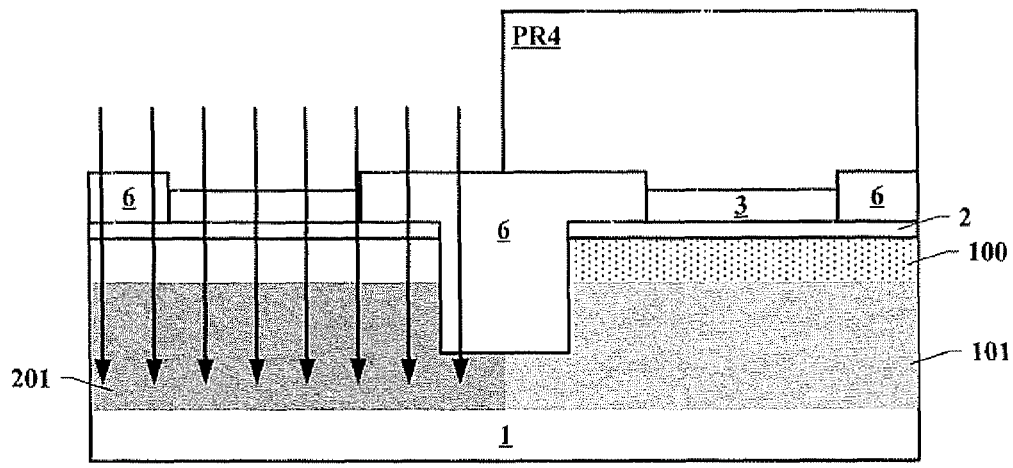

Next, as shown in FIG. 9, the first region on the right side of the SOI wafer is covered by a photoresist mask PR4. A third ion implantation is conducted with a third dopant at a relatively deep position in the second region which is on the left side of the SOI wafer, as indicated by the arrows in FIG. 9. The second region is a region that is adjacent to the first region. In this way, a second back gate isolation region 201 is formed at the relatively deep position of the second region in the semiconductor substrate 1.

Figure 10:
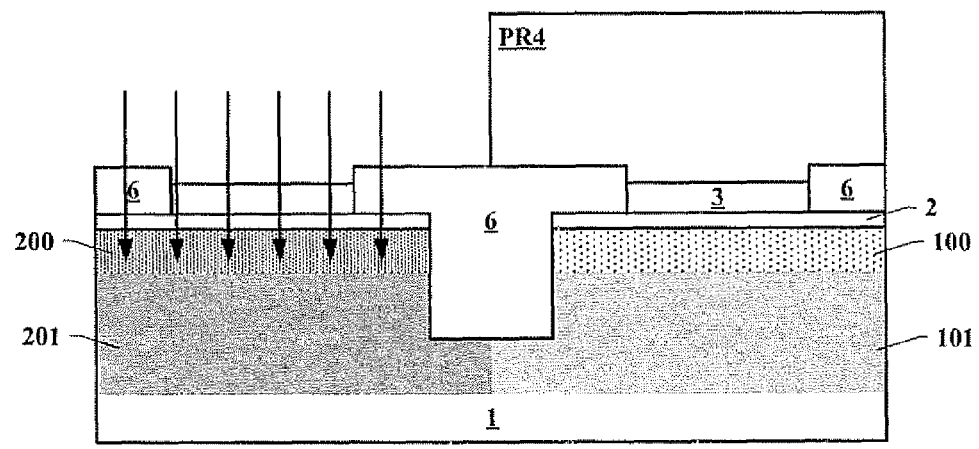

Then, as shown in FIG. 10, after the third ion implantation is completed, a fourth ion implantation is conducted with a fourth dopant at a relatively shallow position in the second region of the SOI wafer, as indicated by the arrows in FIG. 10. In this way, a second back gate 200 is formed at the relatively shallow position of the second region in the semiconductor substrate 1.

The third ion implantation is conducted at the relatively deep position, and the fourth ion implantation is conducted at the relatively shallow position. Optionally, the polarity of the third dopant is opposite to the polarity of the fourth dopant, and the polarity of the third dopant is opposite to the polarity of the first dopant. The second back gate 200 and the second back gate isolation region 201 having different electrical conduction types are formed in the second region of the semiconductor substrate 1 by means of the two ion implantations that use dopants of different polarities and are implemented at different depths. As a result, a PN junction is formed between the second back gate 200 and the second back gate isolation region 201. Furthermore, the doping polarity of the second back gate isolation region 201 is opposite to the doping polarity of the first back gate isolation region 101. Optionally, the second back gate 200 has a relatively high doping concentration, and the second back gate isolation region 201 has a relatively low doping concentration. This helps to form a PN junction having a PN boundary of a relatively broad (or obscure) width, which can further reduce leakage. After the third and the fourth ion implantations are completed, the photoresist mask PR4 is removed.

Figure 11A:
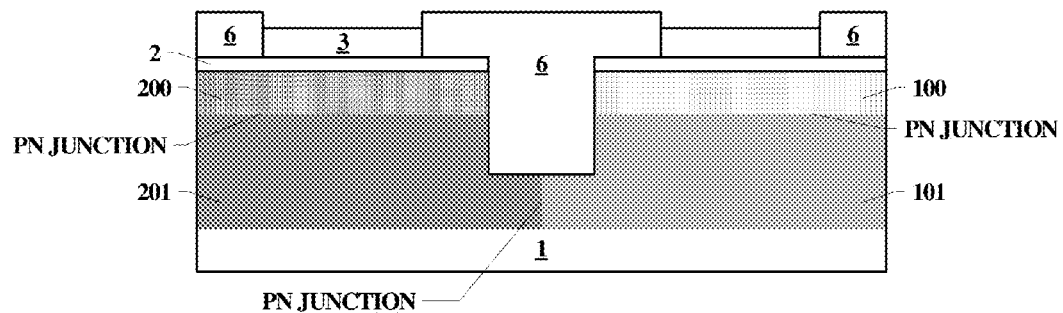

FIG. 11(a) shows a structure of a MOSFET device comprising the first back gate 100, the first back gate isolation region 101, the second back gate 200, and the second back gate isolation region 201. Each MOSFET comprises a back gate and a back gate isolation region under the back gate. The back gate and the back gate isolation region have opposite doping polarities. The back gates of two adjacent MOSFETs are isolated by the shallow trench isolation 6. The back gate isolation regions of the two adjacent MOSFETs have opposite doping polarities, whereby the PN junction is formed.

The total thickness of the shallow trench isolation 6, the semiconductor layer 3, and the insulating buried layer 2 is only about 10 nm-50 nm. As a result, implanted ions can easily enter the semiconductor substrate 1 through these layers. The implantation depth can be controlled by adjusting the ion implantation energy and the dopant dose, so that the implemented dopants are mainly distributed in the semiconductor substrate 1.

Figure 11B:
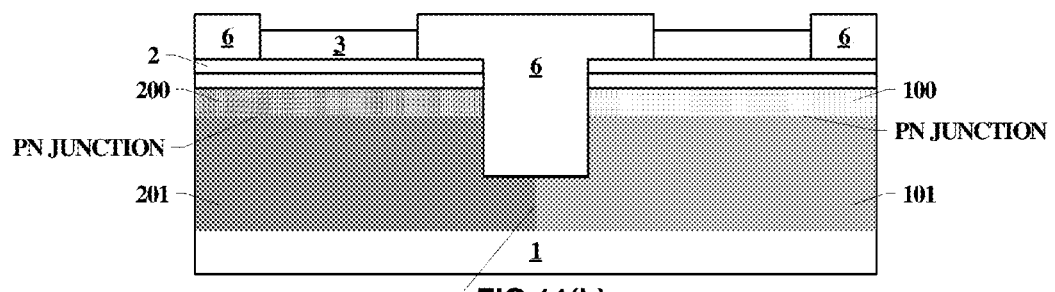

The first back gate 100 and the second back gate 200 may be disposed in an upper portion of the semiconductor substrate 1 to abut the insulating buried layer 2. Alternatively, the first back gate 100 and the second back gate 200 may have a distance from the insulating buried layer 2 without directly abutting it, as shown in FIG. 11(b).

The polarities of the dopants implanted in the second ion implantation for forming the first back gate 100 and in the fourth ion implantation for forming the second back gate 200 may depend on the doping type of the MOSFET and the objective value of the threshold voltage. If it is desired to decrease the threshold voltage of the device, P-type dopants may be used for a P-type MOSFET. The P-type dopants may be one of B, $BF_2$, and In, or a combination thereof. N-type dopants may be used for an N-type MOSFET. The N-type dopants may be one of As and P, or a combination thereof. If it is desired to increase the threshold voltage of the device, N-type dopants may be used for a P-type MOSFET. The N-type dopants may be one of As and P, or a combination thereof. P-type dopants may be used for an N-type MOSFET. The P-type dopants may be one of B, $BF_2$, and In, or a combination thereof.

The implantation dose of the dopants may be selected according to process or product requirements. For example, it may be about $1\times10^{13}$ $cm^{-2}$-$1\times10^{18}$ $cm^{-2}$. In this case, a doping concentration of a portion of the back gate that is not under the channel region is about $1\times10^{17}$ $cm^{-3}$-$1\times10^{20}$ $cm^{-3}$; while a doping concentration of a portion of the back gate that is under the channel region is about $1\times10^{15}$ $cm^{-3}$-$1\times10^{18}$ $cm^{-3}$.

Next, annealing is conducted for a short period (also called "peak annealing"). The annealing may be performed by means of laser, electron beam, or ultra-red irradiation, etc. The annealing repairs crystal lattice damages and activates the implanted dopants in the semiconductor substrate 1.

In this way, the first back gate 100, the first back gate isolation region 101, the second back gate 200, and the second back gate isolation region 201 are formed in two adjacent regions in the semiconductor substrate 1, respectively. Any two adjacent implantation regions in these four implantation regions have dopants of different polarities, so that a PN junction is formed. Furthermore, a shallow trench isolation 6 is formed between two adjacent implantation regions, so that the first back gate 100 is isolated from the second back gate 200. As a result, a structure of PNPN junction or NPNP junction is formed in the back gate regions of two adjacent regions of the SOI wafer.

Figure 12:
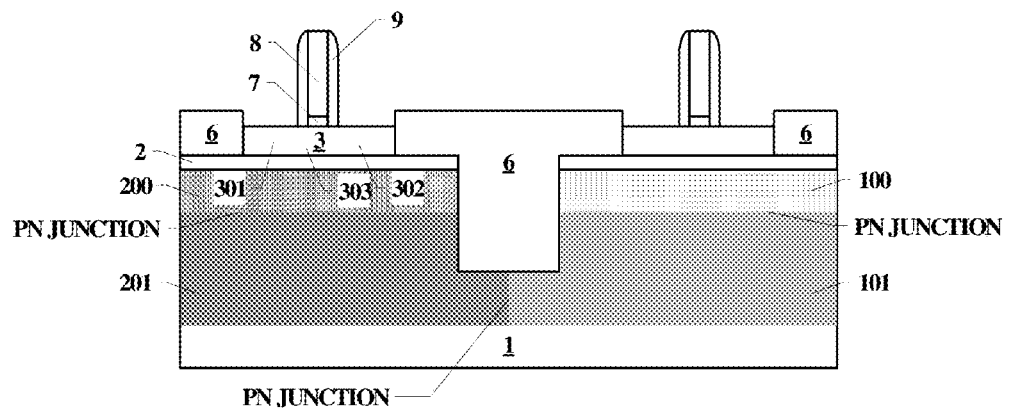

Then, as shown in FIG. 12, other components of the MOSFET devices such as gate stacks are formed on active regions of the SOI wafer by means of regular processes.

In particular, the gate stack comprises a gate dielectric layer 7 and a gate conductive layer 8. The gate dielectric layer 7 may comprise high-K gate dielectric material(s), which may be any one or more of $HfO_2$, HfSiO, HfSiON, HfTaO, HfTiO, HfZrO, $Al_2O_3$, $La_2O_3$, $ZrO_2$, and LaAlO. For example, the gate dielectric layer 7 may be formed by depositing $HfO_2$ to a thickness of about 2-4 nm. The gate conductive layer 8 is disposed on the gate dielectric layer 7. The gate conductive layer 8 can be used to adjust a threshold voltage of the MOSFET. For a pMOSFET, the gate conductive layer 8 may comprise any one or more of MoNx, TiSiN, TiCN, TaAlC, TiAlN, TaN, PtSix, Ni3Si, Pt, Ru, Ir, Mo, HfRu, RuOx. For an nMOSFET, the gate conductive layer 8 may comprise any one or more of TaC, TiN, TaTbN, TaErN, TaYbN, TaSiN, HfSiN, MoSiN, RuTax, NiTax. These materials have different work functions. The material of the gate conductive layer 8 may be selected according to the required threshold voltage of the device. Furthermore, spacers 9 may be formed at opposite sides of the gate stack.

After the gate stack is formed, source/drain implantation may be conducted outside the gate stack by means of regular CMOS processes. In this way, a source region 301 and a drain region 302 are formed in the semiconductor layer 3 outside the gate stack. Also, a channel region 303 is formed between the source region and the drain region in the semiconductor layer by means of regular CMOS processes.

Figure 13:
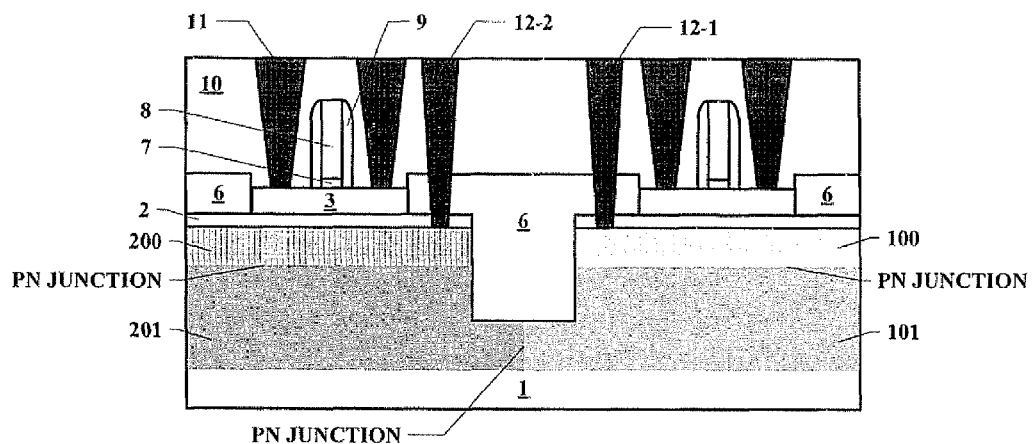

Next, an interlayer dielectric layer 10 is deposited on the SOI wafer. Then conductive paths are formed by means of regular processes. As shown in FIG. 13, a source/drain conductive path 11 is formed to pass through the interlayer dielectric layer 10 and reach the source/drain region. A back gate conductive path 12 is formed to pass through the interlayer dielectric layer 10, the second portion of the shallow trench isolation 6 which extends laterally, and the insulating buried layer 2, and reach the back gate region.

Then, metal material(s) are filled in the conductive paths 11 and the conductive paths 12, so as to form the source/drain conductive paths 11 electrically connected with the source/drain regions, and back gate conductive paths 12-1 and 12-2 electrically connected with the back gates, as shown in FIG. 13.

Figure 14:
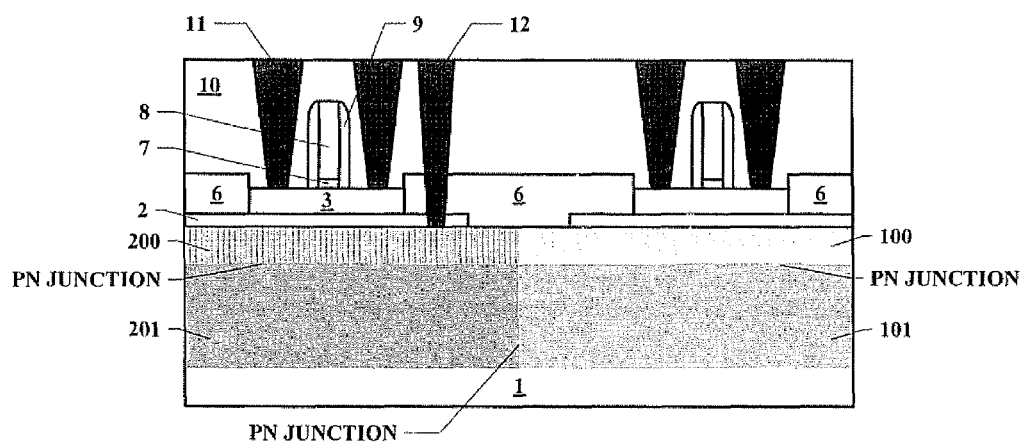
FIG. 14 schematically shows a structural view of another embodiment of the semiconductor device according to the present disclosure.

FIG. 14 schematically shows a structural view of another embodiment of the semiconductor device according to the present disclosure.

The structure of the embodiment shown in FIG. 14 and a method for manufacturing the same generally correspond to the structure of the embodiment shown in FIG. 13 and the method for manufacturing the same. The embodiment shown in FIG. 14 differs from the embodiment shown in FIG. 13 in that the shallow trench isolation 6 does not extend into the semiconductor substrate 1 but only extends laterally over the semiconductor substrate 1, so as to isolate the active regions (the semiconductor layer 3) of the adjacent MOSFETs.

In particular, as shown in FIG. 14, the shallow trench isolation 6 has a "T" shape, which comprises a first portion extending to a surface of the semiconductor substrate 1 and a second portion extending laterally on the insulating buried layer 2. The width of the first portion is smaller than the width of the second portion. The shallow trench isolation 6 isolates active layers (i.e., the semiconductor layers 3) of two adjacent MOSFETs, to define active regions of the MOSFETs. In this way, the back gates, as well as the active regions, of the two adjacent MOSFETs are prevented from being electrically connected. Optionally, the shallow trench isolation 6 may only comprise the second portion extending laterally on the insulating buried layer 2 without the first portion extending to the surface of the semiconductor substrate 1.

In this alternative embodiment, because there is no isolation provided by the shallow trench isolation 6, the back gates of the adjacent MOSFETs contact each other to form a PN junction. Meanwhile, the back gate isolation regions of the adjacent MOSFETs also contact each other to form a PN junction. As a result, a single voltage may be applied to the back gates of the adjacent MOSFETs. Therefore, it is possible to dispose only one back gate conductive path 12 for applying the back gate voltage. As shown in FIG. 14, one back gate conductive path 12 may be disposed in any one of the adjacent MOSFETs having such a structure, to apply the back gate voltage to the adjacent MOSFETs simultaneously.

As a result, the semiconductor device having this structure can use a less number of back gate conductive paths and consume a smaller area, so as to simply process and save cost.

The manufacturing method according to this alternative embodiment generally corresponds to that according to the embodiment shown in FIG. 13, except that in forming the shallow trench isolation 6, when the SOI wafer is patterned, the etching should stop at the surface of the semiconductor substrate 1 or at the surface of the insulating buried layer 2.

As shown in FIGS. 13 and 14, the present disclosure provides an MOSFET with a back gate isolation region by processes as described above. In the MOSFET, the back gate isolation region is formed under a back gate. The back gate and the back gate isolation region have different doping polarities and different bias electrical fields. The back gates of adjacent MOSFETs, as well as the back gate isolation regions of the adjacent MOSFETs, also have different doping polarities and different bias electrical fields. As a result, in addition to back gate isolation implemented by shallow trench isolations 6 between the adjacent MOSFETs, the adjacent MOSFETs are also isolated by means of PNPN junctions or NPNP junctions formed in the back gates and the back gate isolation regions of the adjacent MOSFETs. Accordingly, the back gate conductive paths 12-1 and 12-2 of the adjacent MOSFETs are electrically isolated from each other by means of the PNPN junctions or the NPNP junctions. Compared with conventional MOSFETs, such a structure has a better insulating effect, and thus substantially reduces the possibility of accidental breakdown of the device.

The foregoing description is provided only to illustrate and explain the disclosure, rather than to limit it. Therefore, the present disclosure is not limited to the described embodiments. Any variations or modifications that are obvious to those skilled in the art will fall within the protection scope of the present disclosure.

What is claimed is:

1. A semiconductor device, comprising:
   an SOI wafer, which comprises a semiconductor substrate, an insulating buried layer, and a semiconductor layer, wherein the insulating buried layer is disposed on the semiconductor substrate, and the semiconductor layer is disposed on the insulating buried layer;
   MOSFETs formed in the SOI wafer, wherein each of the MOSFETs comprises a back gate and a back gate isolation region being formed under the back gate, the back gate and the back gate isolation region being formed in the semiconductor substrate; and
   a shallow trench isolation formed between adjacent MOSFETs to isolate the adjacent MOSFETs from each other, wherein the shallow trench isolation comprises:
      a first portion, which extends into the semiconductor substrate to isolate back gates of the adjacent MOSFETs and has a bottom surface in contact with a boundary between back gate isolation regions of the adjacent MOSFETs; and
      a second portion, which extends laterally on the insulating buried layer, with a bottom surface of the second portion in contact with a top surface of the insulating buried layer, to isolate the semiconductor layer of the adjacent MOSFETs to define respective active regions of the adjacent MOSFETs;
      wherein the first portion has a width that is smaller than a width of the second portion;
   wherein a PN junction is formed between the back gate and the back gate isolation region of the each of the MOSFETs and below the shallow trench isolation; and
   wherein another PN junction is formed between back gate isolation regions, which abut each other, of the adjacent MOSFETs.

2. The semiconductor device according to claim 1, wherein the back gate abuts the insulating buried layer.

3. The semiconductor device according to claim 1, wherein the back gate is separated from the insulating buried layer by a distance.

4. The semiconductor device according to claim 1, wherein the each of the MOSFETs further comprises:
- a gate stack disposed on the semiconductor layer;
- a source region and a drain region formed in the semiconductor layer and disposed outside the gate stack; and
- a channel region formed in the semiconductor layer and between the source region and the drain region.

5. The semiconductor device according to claim 4, wherein the each of the MOSFETs further comprises:
- source/drain conductive paths electrically connected with the source region and the drain region, respectively; and
- a back gate conductive path electrically connected with the back gate.

6. A method for manufacturing a semiconductor device, comprising:
- providing an SOI wafer comprising a semiconductor substrate, an insulating buried layer, and a semiconductor layer, wherein the insulating buried layer is disposed on the semiconductor substrate, and the semiconductor layer is disposed on the insulating buried layer;
- forming a shallow trench isolation in the SOI wafer to isolate adjacent MOSFETs, wherein the forming the shallow trench isolation comprises:
  - patterning the SOI wafer to form a first portion of the shallow trench isolation, wherein the first portion extends into the semiconductor substrate to a depth to isolate the back gates of the adjacent MOSFETs and has a bottom surface in contact with a boundary between back gate isolation regions of the adjacent MOSFETs; and
  - further patterning the SOI wafer to form a second portion of the shallow trench isolation, wherein the second portion extends laterally on the insulating buried layer, with a bottom surface of the second portion in contact with a top surface of the insulating buried layer, to isolate the semiconductor layer of the adjacent MOSFETs;
  - wherein the first portion has a width that is smaller than a width of the second portion; and
- forming the MOSFETs in the SOI wafer, each of the MOSFETs comprising a back gate and a back gate isolation region formed under the back gate, the back gate and the back gate isolation region being formed in the semiconductor substrate;
- wherein a PN junction is formed between the back gate and the back gate isolation region of the each of the MOSFETs and below the shallow trench isolation; and
- wherein another PN junction is formed between back gate isolation regions, which abut each other, of the adjacent MOSFETs.

7. The method according to claim 6, wherein the forming the MOSFETs comprises:
- conducting a first ion implantation with a first dopant at a relatively deep position in a first region of the semiconductor substrate to form the back gate isolation region of a first MOSFET at the relatively deep position of the semiconductor substrate; and
- conducting a second ion implantation with a second dopant at a relatively shallow position in the first region of the semiconductor substrate to form the back gate of the first MOSFET at the relatively shallow position of the semiconductor substrate, wherein the polarity of the second dopant is opposite to the polarity of the first dopant.

8. The method according to claim 7, wherein the forming the MOSFETs further comprises:
- conducting a third ion implantation with a third dopant at a relatively deep position in a second region of the semiconductor substrate, the second region being adjacent to the first region, to form the back gate isolation region of a second MOSFET at the relatively deep position of the semiconductor substrate; and
- conducting a fourth ion implantation with a fourth dopant at a relatively shallow position in the second region of the semiconductor substrate to form the back gate of the second MOSFET at the relatively shallow position of the semiconductor substrate, wherein the polarity of the third dopant is opposite to the polarity of the first dopant, and the polarity of the fourth dopant is the same as the polarity of the first dopant.

9. The method according to claim 6, wherein the forming the MOSFETs, for the each of the MOSFETs, comprises:
- forming a gate stack on the semiconductor layer; and
- forming a source region and a drain region in the semiconductor layer and outside the gate stack.

10. The method according to claim 9, wherein the forming the MOSFETs, for the each of the MOSFETs, further comprises:
- forming conductive source/drain conductive paths electrically connected with the source region and the drain region, respectively; and
- forming a back gate conductive path electrically connected with the back gate.

11. The semiconductor device according to claim 2, wherein the each of the MOSFETs further comprises:
- a gate stack disposed on the semiconductor layer;
- a source region and a drain region formed in the semiconductor layer and disposed outside the gate stack; and
- a channel region formed in the semiconductor layer and between the source region and the drain region.

12. The semiconductor device according to claim 3, wherein the each of the MOSFETs further comprises:
- a gate stack disposed on the semiconductor layer;
- a source region and a drain region formed in the semiconductor layer and disposed outside the gate stack; and
- a channel region formed in the semiconductor layer and between the source region and the drain region.

* * * * *